United States Patent
Kim et al.

(10) Patent No.: US 7,863,671 B2
(45) Date of Patent: Jan. 4, 2011

(54) NAND TYPE NON-VOLATILE MEMORY DEVICE AND METHOD FOR FABRICATING THE SAME

(75) Inventors: Nam-Kyeong Kim, Icheon-Si (KR); Won Sic Woo, Guri-Si (KR)

(73) Assignee: Hynix Semiconductor Inc., Icheon-si (KR)

( * ) Notice: Subject to any disclaimer, the term of this patent is extended or adjusted under 35 U.S.C. 154(b) by 205 days.

(21) Appl. No.: 11/770,516

(22) Filed: Jun. 28, 2007

(65) Prior Publication Data
US 2008/0106942 A1 May 8, 2008

(30) Foreign Application Priority Data
Nov. 7, 2006 (KR) ........................ 10-2006-0109611

(51) Int. Cl.
*H01L 29/788* (2006.01)
*H01L 27/115* (2006.01)

(52) U.S. Cl. .................. 257/316; 257/315; 257/390; 257/E27.103; 257/E29.3

(58) Field of Classification Search ................. 257/390, 257/314–316, 321, E27.103, E29.3
See application file for complete search history.

(56) References Cited

U.S. PATENT DOCUMENTS 7,145,199 B2   12/2006   Kajimoto et al.
7,183,615 B2    2/2007   Yamashita et al.
2005/0082602 A1*  4/2005  Okajima ....................... 257/321
2006/0231822 A1* 10/2006  Kim ................................ 257/1

FOREIGN PATENT DOCUMENTS

KR   10-2004-0001998   1/2004
KR   10-2005-0094004   9/2005
KR   10-2006-0063559   6/2006
KR   10-2006-0088637   8/2006

* cited by examiner

*Primary Examiner*—Anh Phung
*Assistant Examiner*—Allison P Bernstein
(74) *Attorney, Agent, or Firm*—Marshall Gerstein & Borun LLP

(57) ABSTRACT

A method for fabricating a NAND type flash memory device includes defining a select transistor region and a memory cell region in a semiconductor substrate, forming a tunnel insulating layer, a floating gate conductive layer, and a dielectric layer over a semiconductor substrate, etching the dielectric layer, thereby forming an opening exposing the floating gate conductive layer, forming a low resistance layer in the opening, forming a control gate conductive layer over the semiconductor substrate, and etching the control gate conductive layer, the dielectric layer, the floating gate conductive layer, and the tunnel insulating layer to form gate stacks of memory cells and source/drain select transistors.

11 Claims, 3 Drawing Sheets

NAND TYPE NON-VOLATILE MEMORY DEVICE AND METHOD FOR FABRICATING THE SAME

CROSS-REFERENCE TO RELATED APPLICATION

Priority to Korean patent application number 10-2006-0109611, filed on Nov. 7, 2006, the disclosure of which is incorporated by reference in its entirety, is claimed.

BACKGROUND OF THE INVENTION

The invention relates to a NAND type flash memory device and a method for fabricating the same. More specifically, the invention relates to a NAND type flash memory device with improved operation speed and a method for fabricating the same.

NAND type flash memory devices are electrically programmable and erasable non-volatile memory devices. NAND type flash memory devices are widely utilized in applications including portable electronics (e.g., MP3 players, digital cameras, camcorders, notebook computers, PDAs, and cellular phones), computer BIOSs, printers, and USB drives.

FIG. 1 shows an equivalent circuit of a NAND type flash memory device.

A memory cell array includes a plurality of cell strings connected to associated bit lines, BL1, BL2, . . . . Each unit cell string includes a source select transistor (SST), memory cells M1-M32, and a drain select transistor (DST). Each drain select transistor (DST) is connected to the one of bit lines, BLe and BLo. Each source select transistor (SST) is connected to a common source line (CSL). The memory cells M1-M32 are serially coupled between the source select transistor (SST) and the drain select transistor (DST). The number of memory cells included in one cell string is varied depending on the storage capacity of memory device used. The gate of the source select transistor (SST) at each cell string is commonly connected to a source select line (SSL). The source select line (SSL) transmits a string select signal supplied from a row decoder. A drain select line (DSL) transmits a drain select signal supplied from the row decoder. The drain select line (DSL) is connected to the gate of the drain select transistor (DST). The control gates of the memory cells M1-M32 are coupled to word lines WL1-WL32, respectively.

A memory cell includes a tunnel insulating layer, a floating gate, a dielectric layer, and a control gate. In the source select transistor (SST) and the drain select transistor (DST), a first polysilicon layer for the floating gate is in contact with a second polysilicon layer for the control gate via a contact hole passing through the intergate dielectric layer. When the contact resistance between the first polysilicon layer for floating gate and the second polysilicon layer for the control gate abnormally increases, signal transmission is delayed and chip failure occurs, thus causing a significant deterioration in fabrication efficiency.

The increased contact resistance is due to a polymer or a parasitic oxide layer formed while etching of the dielectric layer and remaining due to incomplete removal by an etchant, prior to deposition of the second polysilicon layer. In addition, because the contact between the first polysilicon layer and the second polysilicon layer inherently has a high resistance, a delay in signal transmission of the SSL and DSL and an occurrence of chip failure result.

BRIEF SUMMARY OF THE INVENTION

The invention provides a NAND type flash memory device improving operation speed via minimization of the contact resistance in source/drain select transistors and a method for fabricating the same.

In accordance with one aspect of the invention, there is provided a NAND type flash memory device including: a source select transistor, a plurality of the memory cells, and a drain select transistor, each arranged over a semiconductor substrate, wherein the source select transistor and the drain select transistor each have a floating gate and control gate; an opening connecting the floating gate to the control gate in the source select transistor and in the drain select transistor; and a low resistance layer arranged in the opening.

The NAND type flash memory device may preferably further include a spacer arranged between the low resistance layer and the sidewall of the opening.

The NAND type flash memory device may preferably further include a barrier metal layer filling the remaining region of the opening.

In accordance with another aspect of the invention, there is provided a method for fabricating a NAND type flash memory device including: forming a tunnel insulating layer, a floating gate conductive layer, and a dielectric layer over a semiconductor substrate; partially etching the dielectric layer, thereby forming an opening exposing the floating gate conductive layer; filling the opening with a low resistance layer; forming a control gate conductive layer on the semiconductor substrate; and etching the control gate conductive layer, the dielectric layer, the floating gate conductive layer, and the tunnel insulating layer to form gate stacks of memory cell transistors and source/drain select transistors.

The method may preferably further include, prior to forming the opening, forming a buffer layer on the dielectric layer.

The method may preferably further include, after forming the opening, forming a spacer on the sidewall of the opening.

The method may preferably further include after forming the spacer, etching the upper portion of the exposed floating gate conductive layer to recess the floating gate conductive layer.

Preferably, the low resistance layer includes a metal silicide layer.

The method may preferably further include, after forming a metal silicide layer on the inner wall of the opening, forming a barrier metal layer in the remaining region of the opening to reduce the resistance therein.

DETAILED DESCRIPTION OF THE INVENTION

The invention provides a NAND type flash memory device improving operation speed via minimization of the contact resistance in a source select transistor and a drain select transistor and a method for fabricating the same.

Figure 1:
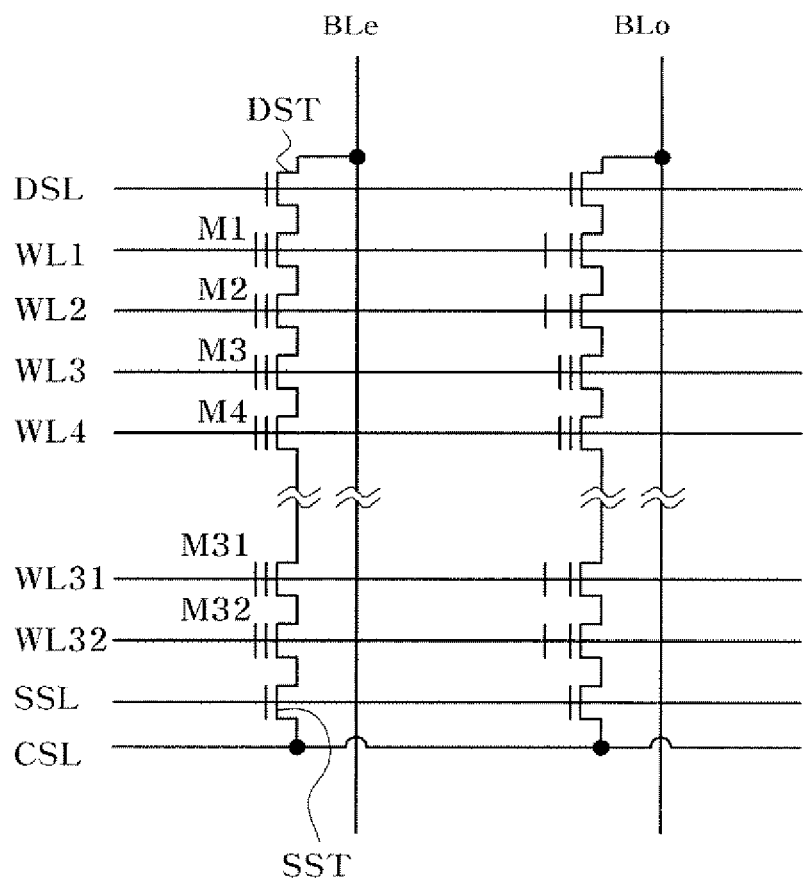
FIG. 1 is an equivalent circuit of a NAND type flash memory device.
Figure 2:
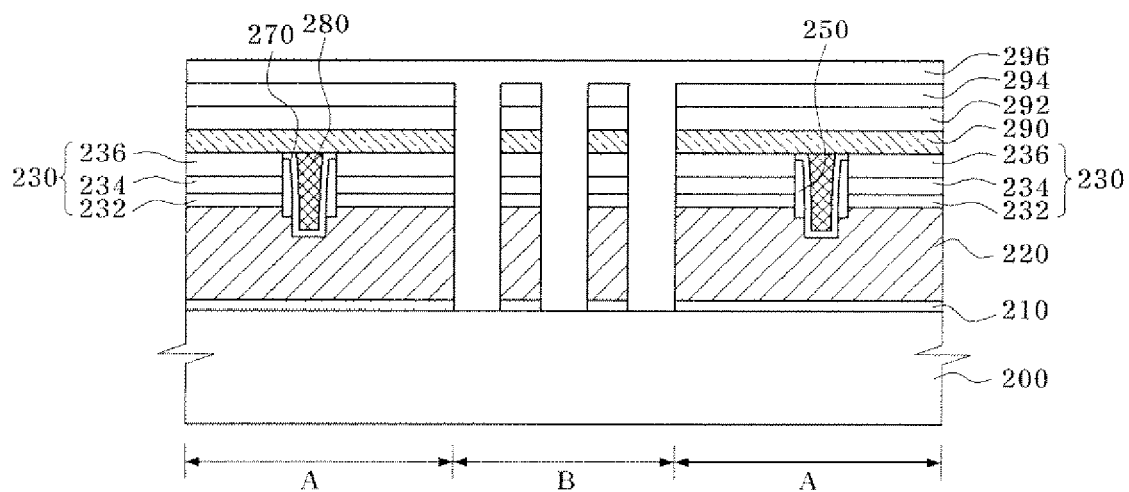
FIG. 2 is a sectional view illustrating the structure of a NAND type flash memory according to one embodiment of the invention.

FIG. 2 is a sectional view illustrating the structure of a NAND type flash memory according to one embodiment of the invention.

A semiconductor substrate 200 includes a region B, where plurality of memory cells are formed, and a region A, where a source select transistor and a drain select transistor are formed.

As shown in FIG. 2, each memory cell arranged in the center of the semiconductor substrate 200 includes a gate stack consisting of a tunnel insulating layer 210, a floating gate 220, a dielectric layer 230, a control gate 290, a low resistance layer 292 arranged over the control gate 290, and a hard mask 294.

The tunnel insulating layer 210 is formed of a silicon dioxide ($SiO_2$) layer.

The floating gate 220 is formed of an impurity-doped first polysilicon layer.

The dielectric layer 230 has an oxide-nitride-oxide (ONO) structure in which an oxide (e.g., $SiO_2$) layer 232, a nitride (e.g., $Si_3N_4$) layer 234, and an oxide (e.g., $SiO_2$) layer 236 are stacked in this order.

The control gate 290 is formed of an impurity-doped second polysilicon layer. Alternatively, the control gate 290 is formed of a metal layer. When the control gate 290 is formed of a polysilicon layer, the control gate 290 may further comprise the low resistance layer 292 made of tungsten (W) or tungsten silicide (WSi), which is arranged over the second polysilicon layer to reduce the resistance thereof, as shown in FIG. 2.

The hard mask 294 is arranged over the control gate 290 or the low resistance layer 292 to protect the underlayers thereof from etching when forming the gate stack.

A contact is arranged in the region A, where a source select transistor and a drain select transistor are formed, such that the first polysilicon layer for the floating gate 220 is in contact with the second polysilicon layer for the control gate 290. The contact is positioned inside an opening formed via etching of the dielectric layer 230. A spacer 250 made of a polysilicon layer, is arranged over the sidewalls of the opening.

In order to reduce the contact resistance between the first polysilicon layer and the second polysilicon layer, a low resistance silicide layer 270 is arranged over the inner sidewalls including the bottom of the opening. The silicide layer 270 is preferably made of a silicide containing one metal selected from titanium (Ti), cobalt (Co), tantalum (Ta), niobium (Nb) and platinum (Pt). The silicide layer 270 preferably has a thickness of 1 Å to 1,000 Å.

A barrier metal layer 280 is arranged such that it fills the remaining portion of the opening. The barrier metal layer 280 is preferably made of a metal selected from titanium nitride (TiN), tantalum nitride (TaN), tungsten nitride (WN) and tungsten (W). The barrier metal layer 280 preferably has a thickness of 1 Å to 5,000 Å.

In the NAND type flash memory device according to one embodiment of the invention, the first polysilicon layer is in contact with the second polysilicon layer via the contact including the silicide layer 270 and the barrier metal layer 280 in each of two select transistors. Thus, the NAND type flash memory device according to the invention has a considerably reduced contact resistance, thereby obtaining increased operation speed, reduced device failure, and thus an improved fabrication efficiency, as compared to conventional NAND type flash memory devices.

FIGS. 3 to 8 are sectional views illustrating a method for fabricating the NAND type flash memory according to the invention. The same reference numerals designate corresponding or identical elements throughout the overall drawings.

Figure 3:
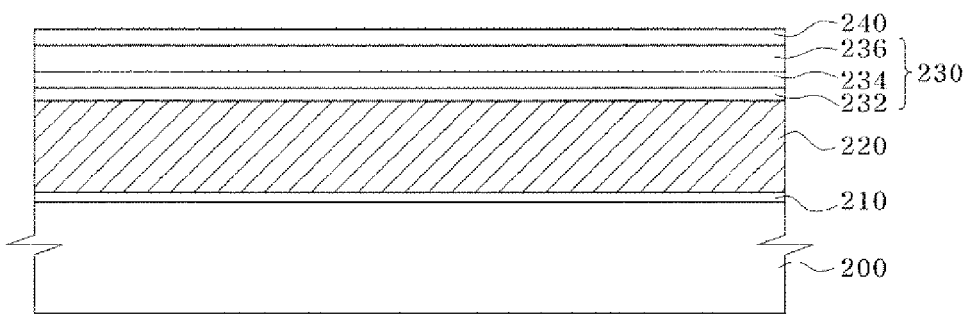
FIGS. 3 to 8 are sectional views illustrating a method for fabricating the NAND type flash memory according to the invention.

Referring to FIG. 3, an oxide layer is grown over a semiconductor substrate 200 to form a tunnel insulating layer 210. A first polysilicon layer 220 for a floating gate is formed over the tunnel insulating layer 210. Although not shown, a device isolation layer and impurity regions used for a source/drain of a transistor are formed in the semiconductor 200 via conventional methods. The impurity regions are formed such that they are uniformly spaced apart from one another. A channel region of the transistor is formed in the semiconductor substrate 200 between the impurity regions. The tunnel insulating layer 210 is a gate insulating layer in the source select transistor and drain select transistor.

Next, a dielectric layer 230 and a buffer layer 240 are deposited over the first polysilicon layer 220. For example, the dielectric layer 230 is oxide-nitride-oxide (ONO) obtained by depositing an oxide layer 232, a nitride layer 234, and an oxide layer 236.

The buffer layer 240 is made of polysilicon. The buffer layer 240 protects the dielectric layer 230 from etching during the subsequent opening formation step.

Figure 4:
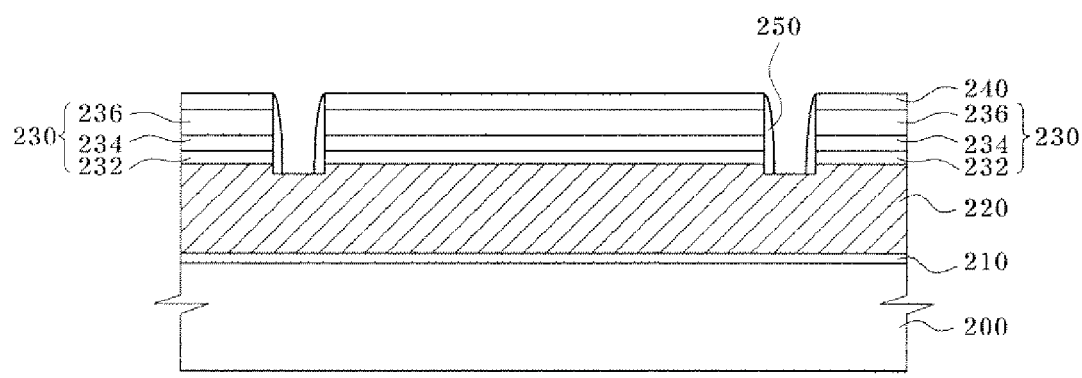

Referring to FIG. 4, a photoresist pattern (not shown) is formed over the buffer layer 240, such that it opens a region where a contact is formed. The contact is formed in a region where gates of the source and drain select transistors are formed. Accordingly, the photoresist pattern is formed in such a manner that the region, where the gates of the select transistors are formed, is opened, but the region, where the memory cells are formed, is masked.

Next, the buffer layer 240 and the intergate dielectric layer 230 are sequentially etched using the photoresist pattern as a mask to form an opening. The etching of the intergate dielectric layer 230 having the ONO structure is carried out by dry etching or wet etching using a liquid chemical. More specifically, the oxide layers 236 and 232 are preferably etched with a fluorine (F)-containing chemical, and the nitride layer 234 is etched with a chemical containing phosphoric acid ($H_3PO_4$) as a base material.

A polysilicon layer is deposited to a predetermined thickness over the opening and the dielectric layer. The polysilicon layer thus deposited is etchbacked to form a spacer 250 on the sidewall of the opening. The spacer 250 protects the sidewall of the opening during the subsequent wet etching of the floating gate polysilicon layer. In addition, to lower the contact resistance, the spacer 250 provides silicon (Si) upon forming the silicide layer in the inner sidewalls of the opening.

Figure 5:
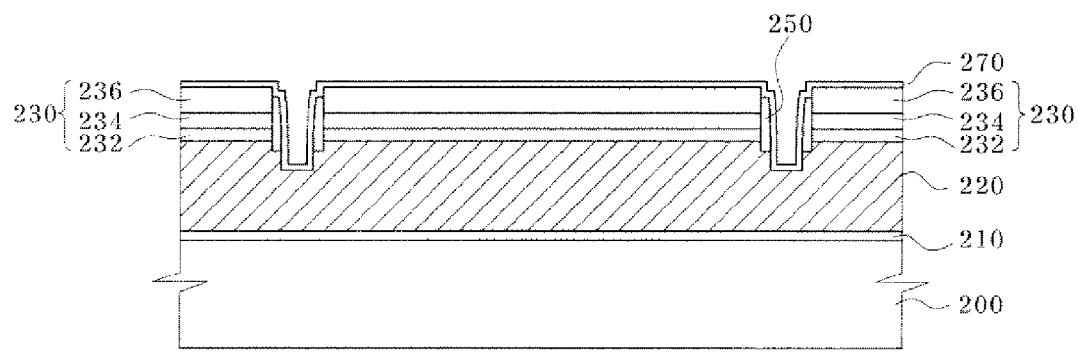

Referring to FIG. 5, the exposed floating gate polysilicon layer 220 is preferably etched to a depth of 1 Å to 1,000 Å with the polysilicon layer etchant, to recess the first polysilicon layer for the floating gate 220. At this time, the sidewalls of the opening is protected via the spacer 250 formed in the opening. The buffer layer 240 arranged over the dielectric layer 230 (see FIG. 4) is also removed during this etching.

In order to reduce the contact resistance in the contact region, where the first polysilicon layer for a floating gate 220 is in contact with the second polysilicon layer for a control gate 290, a low resistance silicide layer 270 is formed over the inner sidewalls of the opening. First, a metal layer (not shown) is formed preferably by depositing a metal selected from titanium (Ti), cobalt (Co), tantalum (Ta), niobium (Nb) and platinum (Pt). The metal layer is heat treated at a predetermined temperature to form a silicide layer 270 via reaction of the metal in the metal layer and silicon (Si) inside the floating gate polysilicon layer 220 or the spacer 250. That is, the silicide layer 270 is formed in the region where the floating gate polysilicon layer 220 or the spacer 250 is in contact with the metal layer. The metal layer still remains in the remaining region of the dielectric layer 230. The heating of the silicide layer 270 is carried out by a rapid thermal process (RTP), to minimize influences which the underlayers undergo. The rapid thermal process (RTP) is preferably performed at a temperature of 450° C. to 1,000° C.

Figure 6:
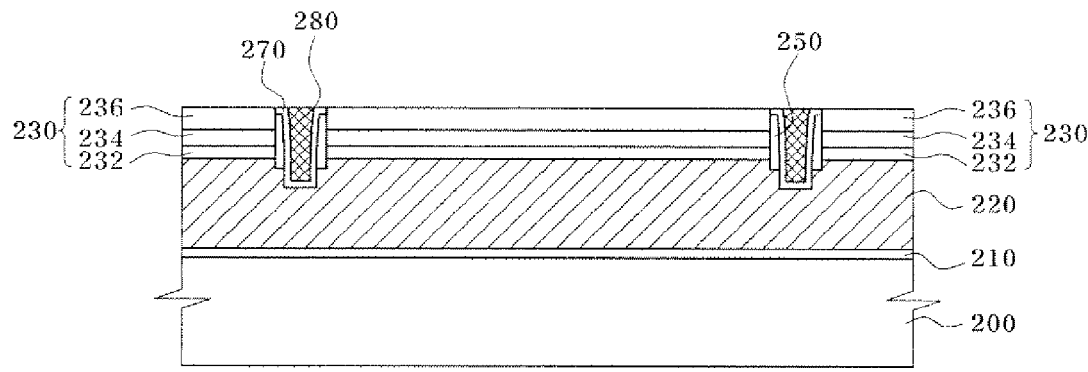

Referring to FIG. 6, a barrier metal is deposited over the silicide layer 270 and the dielectric layer 230 to form a barrier metal layer 280. The barrier metal layer 280 is preferably made of one metal selected from titanium nitride (TiN), tantalum nitride (TaN), tungsten nitride (WN) and tungsten (W). The deposition of the barrier metal layer 280 is preferably carried out by chemical vapor deposition (CVD), physical vapor deposition (PVD) or atomic layer deposition (ALD). The barrier metal layer 280 is preferably deposited to a thickness of 1 Å to 5,000 Å.

The barrier metal layer 280 is subjected to chemical mechanical polishing (CMP) or overall etching to remove the portion of the barrier metal layer 280 over the dielectric layer 230. As a result, the barrier metal layer 280 remains in the opening only. The chemical mechanical polishing (CMP) of the barrier metal layer 280 is performed until the surface of the intergate dielectric layer 230 is exposed to the outside. The overall etching of the barrier metal layer 280 is preferably performed using a mixed chemical of $NH_4OH$, $H_2SO_4$, HCl, $H_2O_2$, $H_2O$, etc.

Figure 7:
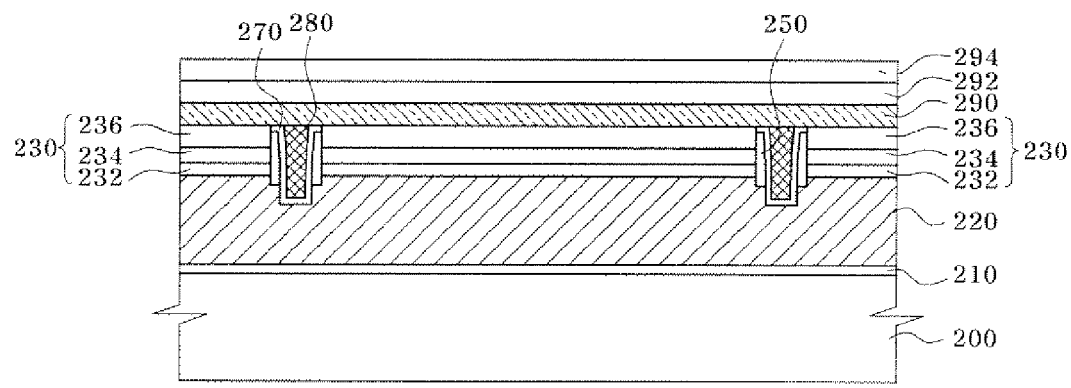

Referring to FIG. 7, a polysilicon layer 290 for a control gate is deposited over the dielectric layer, the spacers, the low resistance silicide layer and the barrier metal layer. In the select transistor regions, the control gate polysilicon layer 290 is in contact with the floating gate polysilicon layer 220 via the contact opening including the silicide layer 270 and the spacer 250.

A low resistance layer 292 is formed by depositing a material such as tungsten silicide (WSi) over the control gate polysilicon layer 290 to reduce the resistance of the control gate. A hard mask 294 is formed over the low resistance layer 292.

Figure 8:
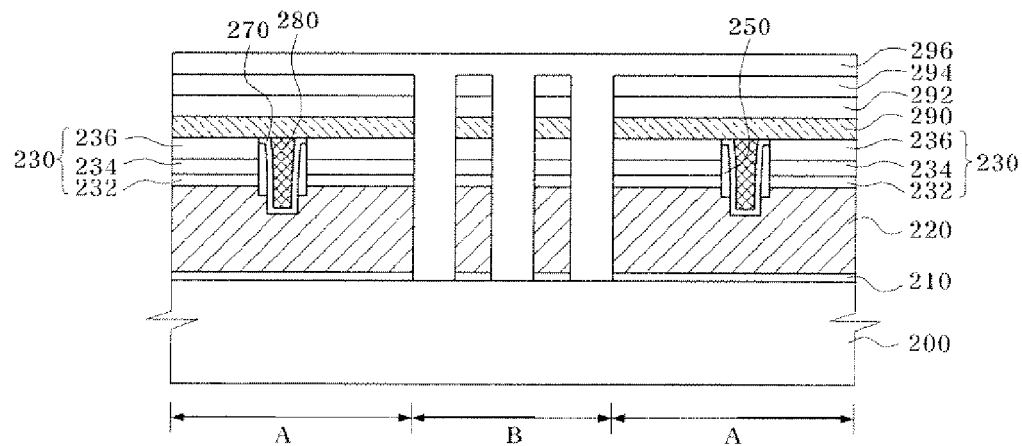

Referring to FIG. 8, a photoresist pattern (not shown) for patterning a gate is formed over the hard mask 294. The hard mask 294, the low resistance layer 292, the polysilicon layer for a control gate 290, the intergate dielectric layer 230, the floating gate polysilicon layer 220, and the tunnel insulating layer 210 are sequentially subjected to anisotropic etching to form gate stacks. An oxide layer is deposited over the gate stacks to form an interlayer dielectric layer 296 for insulating the adjacent gate stacks. Then, the subsequent processes are carried out in accordance with conventional methods to complete fabrication of a NAND-type flash memory device.

As apparent from the foregoing, the NAND-type flash memory device and the method of fabricating the same according to the invention including, in the source and drain select transistors, a first polysilicon layer that is in contact with a second polysilicon layer via a contact made of silicide and a barrier metal. Accordingly, the NAND type flash memory device according to the invention can have a considerably reduced contact resistance, thereby obtaining increased operation speed, reduced device failure, and an improved fabrication efficiency.

The embodiments of the invention have been disclosed above for illustrative purposes. Those skilled in the art will appreciate that various modifications, additions and substitutions are possible, without departing from the scope and spirit of the invention as defined in the accompanying claims.

What is claimed is:

1. A NAND type flash memory device comprising:
    a source select transistor, a plurality of memory cells, and a drain select transistor over a semiconductor substrate;
    a first conductive layer for floating gate formed over the semiconductor substrate of the source and the drain select transistors, and the plurality memory cells;
    a dielectric layer formed over the floating gate of the source and the drain select transistors, and the plurality memory cells;
    an opening formed by etching the dielectric layer to partially expose an upper surface of the first conductive layer for floating gate of the source and the drain select transistors;
    a low resistance layer formed over inner sidewalls and a bottom of the opening;
    a second conductive layer filling openings over the low resistance layer; and
    a third conductive layer for control gate is formed over the dielectric layer, the low resistance layer and the second conductive layer of the source and drain select transistors, and over the dielectric layer of the plurality of memory cells,
    wherein the first conductive layer for floating gate is electrically connected to the third conductive layer for control gate by the second conductive layer and the low resistance layer, and
    wherein a top surface of the floating gate is in contact with a bottom surface of the second conductive layer, and a bottom surface of the control gate is in contact with a top surface of the second conductive layer.

2. The NAND type flash memory device according to claim 1, wherein the low resistance layer comprises a metal silicide layer.

3. The NAND type flash memory device according to claim 2, wherein the metal suicide layer comprises a metal selected from the group consisting of titanium (Ti), cobalt (Co), tantalum (Ta), niobium (Nb) and platinum (Pt).

4. The NAND type flash memory device according to claim 1, further comprising:
    a spacer formed between the low resistance layer and sidewalls of the opening.

5. The NAND type flash memory device according to claim 4, wherein the spacer comprises a polysilicon layer.

6. The NAND type flash memory device according to claim 1, wherein the first conductive layer is selected from the group consisting of titanium nitride (TiN), tungsten nitride (WN), tantalum nitride (TaN), and tungsten (W).

7. A NAND type flash memory device comprising:
    a source select transistor, a plurality of memory cells, and a drain select transistor over a semiconductor substrate,
    a first conductive layer for floating gate formed over the semiconductor substrate of the source and the drain select transistors, and the plurality memory cells;
    a dielectric layer formed over the floating gate of the source and the drain select transistors, and the plurality memory cells;
    an opening formed by etching the dielectric layer to partially expose an upper surface of the first conductive layer for floating gate of the source and the drain select transistors;
    a spacer formed on sidewalls of the opening;
    a low resistance layer formed over the sidewalls of the spacer and a bottom of the opening;
    a second conductive layer filling openings over the low resistance layer; and a third conductive layer for control gate formed over the dielectric layer, the low resistance layer and second conductive layer of the source and the drain select transistors, and over the dielectric layer of the plurality of memory cells, wherein the first conductive layer for floating gate is electrically connected to the third conductive layer for control gate by the second conductive layer and the low resistance layer, and wherein a top surface of the floating gate is in contact with a bottom surface of the second conductive layer, and a bottom surface of the control gate is in contact with a top surface of the second conductive layer.

8. The NAND type flash memory device according to claim 7, wherein the low resistance layer comprises a metal silicide layer.

9. The NAND type flash memory device according to claim 8, wherein the metal silicide layer comprises a metal selected from the group consisting of titanium (Ti), cobalt (Co), tantalum (Ta), niobium (Nb) and platinum (Pt).

10. The NAND type flash memory device according to claim 7, wherein the spacer comprises a polysilicon layer.

11. The NAND type flash memory device according to claim 7, wherein the first conductive layer is selected from the group consisting of titanium nitride (TiN), tungsten nitride (WN), tantalum nitride (TaN), and tungsten (W).

* * * * *